United States Patent [19]

Maier

[11] 4,137,096
[45] Jan. 30, 1979

[54] LOW COST SYSTEM FOR DEVELOPING SOLAR CELLS

[76] Inventor: Henry B. Maier, 6 Sealey Ave., Hempstead, L. I., N.Y. 11550

[21] Appl. No.: 773,914

[22] Filed: Mar. 3, 1977

[51] Int. Cl.² .................. H01L 31/04; C25D 11/00
[52] U.S. Cl. .................. 136/89 TF; 136/89 C; 204/35 R; 204/40; 204/48; 204/56 R
[58] Field of Search .............. 204/40, 48, 56 R, 37 R, 204/35 R; 136/89 CD, 89 TF, 89 P, 89 C

[56] References Cited

U.S. PATENT DOCUMENTS

| | | | |
|---|---|---|---|
| 3,396,057 | 8/1968 | Webb | 136/89 TF |
| 3,411,050 | 11/1968 | Middleton et al. | 136/89 TF X |
| 3,514,847 | 6/1970 | Hotine | 29/572 |
| 3,568,306 | 3/1971 | Yamashita | 29/572 |
| 3,586,541 | 6/1971 | Chamberlin | 136/89 TF X |
| 3,615,877 | 10/1971 | Yamashita | 148/1.5 |
| 3,884,779 | 5/1975 | Duy et al. | 204/92 |
| 3,887,995 | 6/1975 | Gauthier | 29/572 |

*Primary Examiner*—Aaron Weisstuch

[57] ABSTRACT

Low cost solar cells are made by electrodeposition of a metallic coating on a conductive substrate, followed by cathodic conversion of the coating in a thiosulfate containing bath to form metallic sulfides. Electrical contacts are made to portions of the sulfide layer and the coated substrate is dried to a point sufficient to yield a photoresponsive device.

7 Claims, No Drawings

LOW COST SYSTEM FOR DEVELOPING SOLAR CELLS

BACKGROUND OF THE INVENTION

Just as, in the field of chemical synthesis or catalytic conversions, a new process can open up a whole new economic approach for a range of products for synthesis and utilization, so with this invention — a new choice of materials structuring and a simple processing arrangement, as outlined herein — can open up a more sound and economical development in the field of solar cells for widespread applications in solar electric power generation.

It is the present state of confusion in solar cell development which shows why the need for this invention became apparent.

I. WHY THE EXISTING THEORY WAS INADEQUATE.

From today's present crisis in electrical energy capabilities, and tracing back about a decade, the possibilities for electrical energy from solar cells to meet consumer and industrial demands seemed bright.

The Apollo Spacecraft mission clearly showed the significance of cells powered by sunlight to meet many electrical needs in space. Other projects were planned for use in space, having even wider applications of such solar cells or solar batteries.

Why is it that such projects did not lead to major earth borne solar cell applications? Why is it that today the hope of meeting even a 3% portion of the total energy requirements of the nation by means of solar electricity seems optimistic? Where, in the fast moving pace of the decade, with billions of dollars allocated to research in energy, have the solar cell requisites gone?

Progress in solar cell development was curtailed through its own limitations, by the lack of the present day solid state theory to provide an inexpensive solar cell!

A bit of reflection will show the reason.

Technology requires theory and a known market need — point "a" and point "b". To go from point "a" to point "b" is easy — if the theory coincides for point "a" and can produce a product which satisfies the need at point "b".

Can technology produce solar electricity selling at prices which must be no greater than electricity from existing supplies — when the theory can only start from rare materials whose purchase price already exceeds the allowable construction estimates?

Such construction estimates, it must be remembered, derive from the larger cost estimates in which the cells are located in specially designed systems such that the d.c. output generally can be converted to a.c. output and phase into substations or regional grids. High priced solar cells are hopeless for such requirements.

A theory which calls for ultrapure semiconducting metal is already self defeating, in regard to producing solar cell construction for meeting the mass market for consumer electricity — a field for which the original theory was never intended!

II. DERIVATION OF THE NEW THEORY.

Referring again to the concept of going from point "a" to point "b" via technology, it is clear that one must see the full picture.

The solar cell should be made from materials which are inexpensive, readily available and ecologically acceptable, and the processing should be inexpensive and, if possible, simple.

The total requirements for solar cells will be stupendous.

The processing probably will have to be performed by inexperienced people working in simple facilities, as well as by trained specialists working in modern factories.

From such a severe set of requirements there does remain much hope.

Several metals can be found which meet all or part of these needs, for use in inexpensive solar sensitive materials systems. One such material is aluminum or its alloys; these are products which, from an engineering viewpoint, are very easy to work with and can serve as structural supports, bases for receiving electrodeposits, and terminal plates or electron collectors. Another important material is iron and its alloys, particularly alloys of iron and nickel; these materials easily form electrodeposits, and may be used as a matrix into which other desired elements may be added during electroforming.

Neither aluminum, iron or nickel are semiconductors.

Going back now to the conventional theory of semiconductors, using holes and electrons — this theory seems to be a special case of an unspecified but broader phenomenon — that of the generation of free electrons in a material.

A material does not have to be a doped, ultra-pure metal of semiconducting origin. A material can be a composition of matter, a mixture of different types of atoms or even molecules, etc. The reasoning then becomes: How can a material in general be made to provide free electrons?

From transistor theory, holes and electrons are generated in semiconducting pure metals by the addition of dopants of atomic configuration differing from the configuration of the semiconducting metal in consideration (such as germanium or silicon, doped with appropriate impurities). Cadmium sulfide appears to be a special case.

If the dopants act by what might be considered a distortion of the crystalline lattice to produce the electronically active areas, then a material in general can be made to produce free electrons, by creating the proper types of distortions.

From this, a theory is now evident. The transition areas between one material and another might provide sufficient numbers of distortion areas to allow a significant number of outer electrons contained in some of the atoms to make quantum jumps into the conducting range when energized by light. (This is a functin of interatomic strain, although stress might be a better word, since the transistion areas would be designed or "stressed" for potential free electron activity.)

Materials which therefor would satisfy this theory might, for example, consist of an oxide or impure oxide coating, formed through electrolysis, upon an aluminum foil or panel substrate, or upon an iron or impure iron film electrodeposited upon the foil or panel. The oxide coating might consist of aluminum oxide or iron oxide, in pure or impure states, or mixtures of the same, which, if correctly prepared might be made to range from conducting to semiconducting to insulating, as desired, to serve, if required, as a matrix within which other suitable elements may be incorporated during the processing of the coating.

The distortion areas might be made to increase if, during film formation, a process such as electrochemistry is used and a higher impressed voltage between the electrodes occurs. The concept here is that a distortion could imply an energy input greater than that for a lower or more neutral state.

Distortion areas may of course also be increased simply by a doping process during the film formation stage. Where aqueous electrochemistry is involved, doping is very simple — just add larger amounts of the doping chemicals to the electrolyte bath to produce smaller amounts of the dopant in the film.

Doping through proper dip baths must also be considered, as a stage in the overall electrochemical processing.

III. SPECIAL CONSIDERATIONS REGARDING THE INVENTION.

Crystallographic Theory

In the crystallization of elements, lattice structures of many types are formed, due to the influence of adjacent atoms and their bonding characteristics. Simple lattice structures resulting from the crystallization of pure materials can become more complex as impurities enter into the picture. The superimposed components may cause boundary areas between the mixed atoms to possess differing degrees of strain. Such complex structures and grain systems may give rise to paths whereby free electrons could form and migrate if energized by radiant energy.

Many coating types are possible, therefor, within the scope of this invention, even though the major constituents of the formulations are restricted to materials which are inexpensive to obtain, because the combinations may be varied so greatly, and produce so many different complex crystal configurations.

Anodizing

In the plating of metals or metal combinations by means of electrodeposition from aqueous solutions, gases are often evolved — hydrogen is liberated at the cathode, along with the metal or alloy composition, and oxygen is evolved at the anode. If the deposit is then made anodic or if the polarity in the bath is then made to give a reverse electrolysis current flow, the fresh electroplate will be covered by active oxygen and may become subject to oxidation, forming a metallic oxide film by a process referred to as 'anodizing'. An anodized film may be poorly conductive or insulating in its electrical characteristics, depending upon how it is made. This anodizing operation therefor can form the basis for developing metallic deposits of controlled alloy or impurity content, and then converting said deposits into films of controlled degrees of semiconductivity. Such coatings, by proper control of dopants or other components may simulate a means for obtaining photovoltaic responses such as obtained by present day semiconductors as used in the electronics fields of manufacture.

Electrochemistry

The processes of electrochemistry are selected for constructing the solar cells because they are so extremely versatile and so simple. Materials at the cathode receive electrons; materials at the anode lose electrons. This provides a technique to form a great variety of films and coatings beyond the scope of high temperature metallurgy. Films formed by electrochemistry may be built up in a manner in which molecular design takes on practical meaning.

The ingredients in the bath may be selected from a range of materials which runs into the thousands. A copy of the *Handbook of Chemistry* contains a section on the properties of inorganic compounds. This listing gives an idea of the scope of the salts which may be used as additives to the basic bath types, to further modify the coating defect states and further improve the photovoltaic responses. Also, the composition of the anodes in the electrolysis may be chosen from a wide range of metals and alloys. Nickel, iron and steel anodes, however, should be given first consideration because of their relative low cost and their direct application to the building of the electrodeposit at the cathode.

Potentials

It is expected that the potentials of the cells will vary depending upon the compositions used; the potentials will probably also vary with the light conditions. This latter property may pose difficulties in switching systems in commercial use, since the power drain will vary not only with the needs of the day but also with the type of sunlight. With solar cells for commercial use, the output may depend upon bringing in or cutting out banks of cells, to match voltage level requirements.

If the cells are not made properly, local variations in potentials at contact points may occur. Careful quality control is necessary.

Surfaces

A rough texture for the solar cell coating may be important, depending upon whether or not the coating possesses weak or strong photovoltaic properties. If the particular photovoltaic material is not a strong generator of electricity then a textured or granular surface has more surface area than a smooth coating for a given perimeter. Also, a rough or granular surface would take up more sunlight from the first reflection.

Strains

In the expanded type of solid state theory explained in this invention, the most difficult portion to describe is that of strains. To begin with, there is no present solid state theory that must be adhered to. There are explanations, some of which relate to holes and electrons, single crystals and pure and doped semiconductors. But is should be realized that these are not the constraints which should limit solid state investigations. The solid state is simply that phase of matter before the liquid and gaseous states, and as such has been studied for centuries. Decades before the transistor was known, solid state physics, chemical physics and physical chemistry were applied to investigate physical characteristics in the conduction of electricity in matter. The p-n junction just happens to be one approach.

With the art now described in its proper perspective, we return to the strain concept. Visualize for the moment rectangular patterns, comprised of quantities of two or more basic units repeating to form thin, flat structures of differing designs. The strain is that part of the construction which, if the units were atoms or molecules, by means of isolation or other deforming procedures, would force outer electrons to fit into a responsive state whereby they could easily become free electrons. An elastic model makes the concept easier to perceive. The strain is the twisting or force which reflects into the electron path due to the presence of material added into the pattern in whatever way is suitable to produce the free electron tendency.

Dip Coatings

Various types of dip baths or dip coatings, without electrolysis, may be used in stages of the solar cell construction. Cleaning of metal panels by acid or alkaline solutions; redox reactions to convert surface films; chemical reactions to form special surface compositions; dip coatings to provide metallic sulfide films, and other procedures may be used as desired.

Purity of Materials

Since this invention relates to inexpensive forms of solar cells, comprising films and coatings of mixed types of atoms, starting the processing using ultra-pure or electronic grade chemicals is not necessary or desired, and the use of ultra-pure single crystal metals certainly is not indicated. Reagent grade or even commercial grade chemicals and materials should be used.

IV. EXAMPLE OF SOLAR CELL CONSTRUCTION DEVELOPMENT.

This example is presented to show how a solar cell may be developed within the scope of this invention. Since the atomic constituents in the cell are restricted mainly to aluminum, iron, nickel, zinc, oxygen and sulfur, with the choice in this range in order to maintain low costs, consideration must be given as to which one or more of these elements to select. Consideration must also be given as to the degree of complexity to be adhered to in the design and construction of the cell. Practice will show the extent of variations possible in making a projected cell type.

Cost analyses of materials might point out, as an example, a possible route using the following materials: aluminum, iron, iron oxide and iron sulfide. Working from this approach (as a starting point for investigating the numerous combinations possible), an aluminum panel might be plated with a thin film or a flash coating of iron, and then iron sulfide might be electroformed as a deposit on top of the iron, where said iron film will later partially oxidize in the air to form iron oxide. The interfaces between the materials are to be the areas where free electrons are expected to be generated when the cell is tested for electrical output.

During plating of the aluminum panel to form the iron deposit, the top portion of the panel is left uncoated and does not dip into the electrolysis bath in order that this portion may later serve as the positive pole when making connections to the ammeter during testing for cell output. The outer surface of the deposited layers is connected to the ammeter at that time as the negative pole, using slight pressure from an aluminum strip acting as a contact.

The flash coating or thin film of iron is deposited from an electrolyte bath consisting of ferrous sulfate dissolved in distilled water (or in tap water, if the mineral content of such water proves acceptable). A nickel wire anode may be used and should be properly shaped to provide effective throwing power. A voltage of less than 40 volts d.c. may be used for the plating. After the iron deposit is formed the current is turned off and a portion of photographer's concentrated, formulated hypo fixing solution may be mixed into the bath and electrolysis then continued. A proper type of fume hood should be used for safe ventilation in case hydrogen sulfide gas is evolved during electrolysis. An iron sulfide type coating would deposit onto the iron film. (Hypo solution can contain the available sulfur for forming the sulfide, however, sodium thiosulfate might be studied for addition to the bath, under proper control of pH and with other additives as required.) The panel is maintained as cathodic.

The assembly now contains an aluminum substrate, a thin iron deposit and an overlying iron sulfide layer. This is not a completed solar cell but it will or should show an electrical output in the microampere range, and probably in the low microampere range, at a point just before the cell is completely dry. When the cell is completely dry a color change takes place and an interfering type of iron oxide appears to form and block the action of the electron output. Further development study and work is needed. However, and this is the important point: at this stage, this assembly now represents most of the material cost, and it is obviously very inexpensive. Further changes should not increase the cost by any large degree. The work at this stage is to find what additives or what changes should be made to the bath, or how the assembly should be modified to reduce the undesired effects of the particular type and purity of the oxide, or how the grain structure should be modified. A higher electrical output must be achieved, particularly when this cell is completely dry and the effects of air reactions and weathering have occurred.

A word of caution: It is important that good contact should occur between the deposited layers for coating defect conditions within which free electrons might occur. It is also important that sulfates rather than chlorides be used in the baths, since chlorides could produce the unsafe conditions of the formation of chlorine gas or the production of unstable perchlorate compounds.

As can be seen and understood from the foregoing disclosure, it is now obvious to anyone skilled in the art, and in particular to anyone skilled in the art and science of physical chemistry, that this invention is an important advance in providing for low cost solar electric power.

I wish it to be understood that I do not desire to be limited to the exact details described, for obvious modifications will occur to a person skilled in the art.

Having thus described the invention, what I claim as new and desire to be secured by Letters Patent is as follows:

1. A method of making a solar cell comprising electroplating an aluminum or aluminum alloy substrate with a flash coating of iron, leaving a contact portion thereof uncoated, cathodically electrolytically treating said coated substrate in a photographic hypo or other thiosulfate containing bath to convert a portion of said iron coating to iron sulfide, applying an aluminum contact to a portion of said iron sulfide layer, and drying said coated substrate sufficiently to yield a solar cell which generates a photovoltage and photocurrent upon exposure to radiant energy.

2. A solar cell comprising an aluminum substrate having an electrodeposited layer of iron thereon, a conversion coating of iron sulfide formed on said iron layer, and an aluminum contact to a portion of the surface of said iron sulfide layer.

3. A method of making an electroresponsive cell comprising electroplating an aluminum or aluminum alloy substrate with a metallic flash coating, leaving a contact portion thereof uncoated, cathodically electrolytically treating said coated substrate in a bath comprising photographic hypo or other thiosulfate containing bath, to form the electroresponsive coating thereon by the said electrolytic action, and then applying a metallic contact to a portion of said electroresponsive layer, and drying said coated substrate sufficiently to yield an electroresponsive cell which generates a voltage and current upon excitation by solar or radiant energy.

4. An electroresponsive cell comprising an aluminum substrate having an electrodeposited layer comprising iron thereon, a conversion coating comprising iron sulfide formed on said electrodeposited layer, and a metal contact to a portion of the surface of said sulfide layer.

5. A method of making an electroresponsive cell, comprising electroplating a metallic surface, leaving a contact portion thereof uncoated, cathodically electrolytically treating said coated substrate in a photographic hypo or other thiosulfate containing bath to convert a portion of the said coating to a metallic sulfide, applying one or more metallic contacts to portions of said sulfide composition, and drying said coated substrate sufficiently to yield an electroresponsive cell which generates a voltage and current upon energizing by solar or radiant energy.

6. An electroresponsive cell comprising a metallic or metal surfaced substrate having thereon an electrodeposited metallic layer, a conversion coating comprising metallic sulfides formed on said electrodeposited layer, and one or more metal contacts to one or more portions of the electrodeposited composition.

7. A method of making multilayer electrical voltage and current generating devices, comprising electrodepositing on a metallic surface substrate a metallic coating, leaving a contact portion thereof uncoated, cathodically electrolytically treating said substrate in a bath comprising photographic hypo or other thiosulfate containing bath to permit a portion of the coating to be formed as metallic sulfides, applying one or more metallic contacts to portions of said sulfide composition, and drying said coated substrate sufficiently to yield an electroresponsive device which generates a voltage and current upon input of solar or radiant energy.

* * * * *